United States Patent [19]
El Hajji

[11] Patent Number: 5,936,904
[45] Date of Patent: Aug. 10, 1999

[54] DEVICE AND PROCESS FOR READING/REWRITING A DYNAMIC RANDOM ACCESS MEMORY CELL

[75] Inventor: Noureddine El Hajji, Grenoble, France

[73] Assignee: SGS-Thomson Microelectronics S.A., Gentilly, France

[21] Appl. No.: 09/150,255

[22] Filed: Sep. 9, 1998

[30] Foreign Application Priority Data

Sep. 23, 1997 [FR] France ................................. 97 11807

[51] Int. Cl.$^6$ ............................. G11C 7/00; G11C 11/00
[52] U.S. Cl. ..................... 365/205; 365/207; 365/208; 365/154; 365/203
[58] Field of Search ................................. 365/207, 208, 365/203, 205, 154, 156, 189.01

[56] References Cited

U.S. PATENT DOCUMENTS

| | | | |
|---|---|---|---|
| 3,959,781 | 5/1976 | Mehta et al. ........................... | 365/154 |
| 5,241,503 | 8/1993 | Cheng ................................... | 365/205 |
| 5,339,274 | 8/1994 | Dhong et al. .......................... | 365/203 |
| 5,418,737 | 5/1995 | Tran ...................................... | 365/208 |
| 5,619,467 | 4/1997 | Sim ....................................... | 365/207 |

FOREIGN PATENT DOCUMENTS 0 306 712   3/1989   European Pat. Off. .......... G11C 7/06

*Primary Examiner*—Trong Phan
*Attorney, Agent, or Firm*—Allen, Dyer, Doppelt, Milbrath & Gilchrist, P.A. Attorneys at Law

[57] ABSTRACT

The device includes, for each column of the memory, a precharge circuit and an amplifier. The amplifier includes two inverters each formed by two complementary transistors and controlled by two successive signals, read and rewrite. The amplifier includes a decoupling structure connected between the two P-channel transistors and the two N-channel transistors of the inverters and is formed by two pairs of complementary decoupling transistors connected in parallel. The decoupling structure is able on command to take at least a first state in which all the decoupling transistors are on, and a second state in which the two decoupling transistors having a channel with the same type of conductivity are on, while the other two decoupling transistors are off.

22 Claims, 2 Drawing Sheets

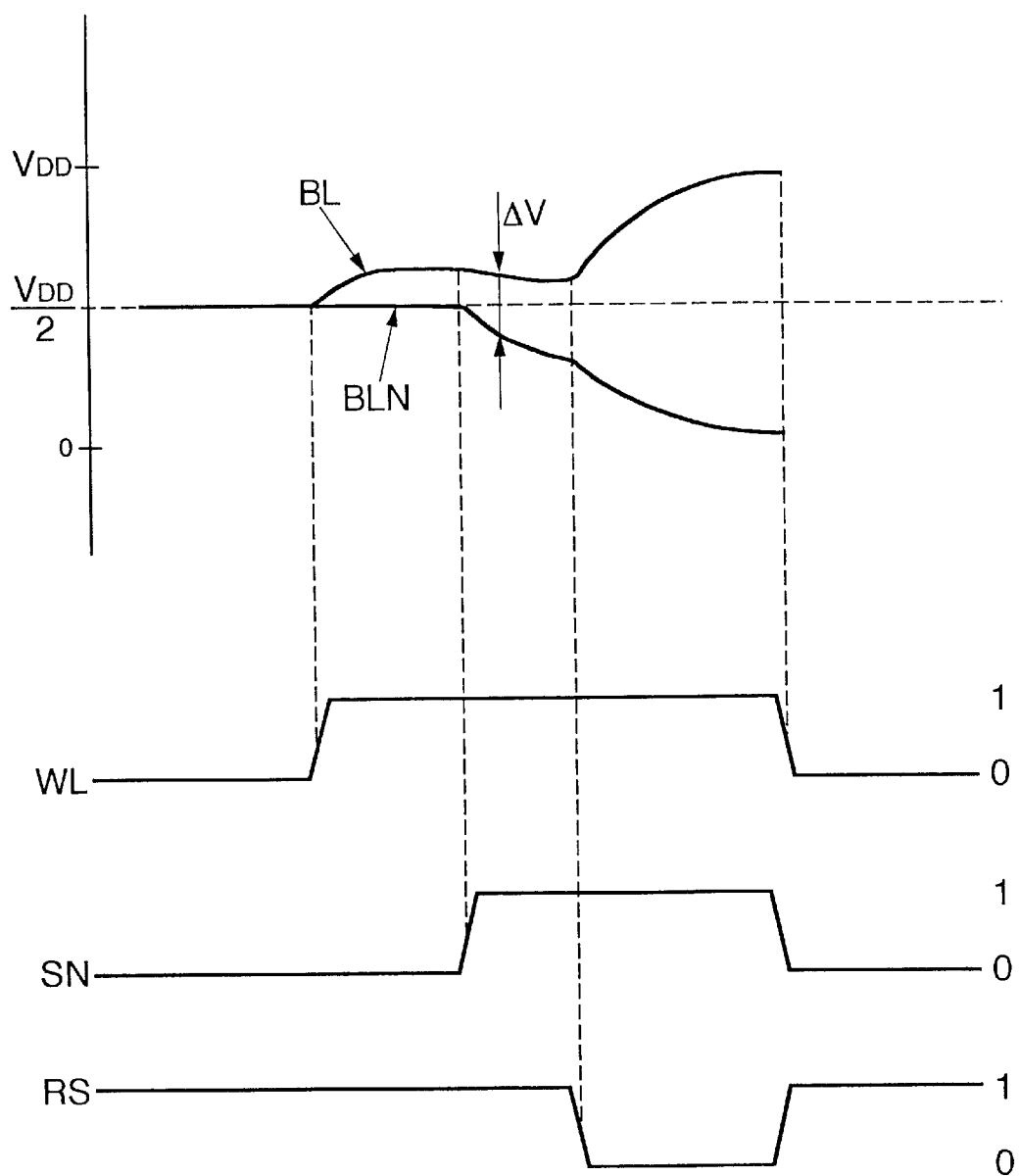

DEVICE AND PROCESS FOR READING/REWRITING A DYNAMIC RANDOM ACCESS MEMORY CELL

FIELD OF THE INVENTION

The invention relates to the reading/rewriting of a memory cell or memory slot of a dynamic random access memory (DRAM), and, more particularly, but not exclusively, to a memory cell or memory slot with one, two or three transistors.

BACKGROUND OF THE INVENTION

As opposed to static random access memories (SRAM) in which the information stored remains so stored indefinitely at least for as long as this memory remains energized, dynamic memories exhibit the feature of requiring a periodic refreshing of the information stored. This is so because of the stray leakage currents which discharge the storage capacitance of each memory cell. Among dynamic random access memory cells, mention may be made in particular of those comprising two or three transistors, and those comprising a single transistor. For these types, the stored information is destroyed by reading.

Conventionally, dynamic random access memories are laid out in rows and columns of memory cells and comprise, for each column, an amplification device for reading/rewriting each memory cell selected. The memory also includes precharge means making it possible to precharge the corresponding column of the matrix (commonly termed a "Bit Line" by those skilled in the art) to a chosen voltage level. The device also includes amplification means comprising two looped-back inverters (forming a bistable flip-flop) each formed by two complementary transistors and controlled by two successive signals, read and rewrite (commonly known respectively as "sense" and "restore").

Conventionally, these two inverters are connected together directly head-to-tail and this may lead to erroneous refreshing of the memory cell if, while reading, the voltage difference between the bit line and the bit line of the immediately adjacent column (serving as reference) is less than the offset voltage of the amplifier.

SUMMARY OF THE INVENTION

In view of the foregoing background, it is therefore an object of the invention to overcome the difficulty associated with the offset voltage of the amplifier, while also reducing the access time for reading the stored information.

To this end, the invention proposes to insert, between the P-channel transistors and the N-channel transistors of the two inverters of the amplification means, a decoupling structure. The decoupling structure is able, moreover, to allow a reduction in the time required to write information to the memory cell during a write cycle, while not diminishing the level of the charge stored in the storage capacitor. This is so particularly while writing a logic "1".

The invention therefore provides a device for reading/rewriting a memory cell of a dynamic random access memory laid out in rows and columns. This device comprises, for each column, precharge means and amplification means comprising two inverters each formed by two complementary transistors and controlled by two successive signals, read and rewrite. According to a general characteristic of the invention, the amplification means comprise a decoupling structure connected between the two P-channel transistors and the two N-channel transistors of the inverters.

The decoupling structure is formed by two pairs of complementary decoupling transistors connected in parallel. Furthermore, the decoupling structure is able on command to take at least a first state in which all the decoupling transistors are on, and a second state. In the second state the two decoupling transistors having a channel with the same type of conductivity are on (for example the NMOS decoupling transistors), while the other two decoupling transistors (in this instance the PMOS transistors) are off.

The invention is also directed to a process for controlling such a read/rewrite device. In accordance with the process the decoupling structure is placed in its first state in the course of a cycle of writing to the memory cell, and the decoupling structure is placed in its second state in the course of a read/rewrite cycle following a precharge phase. Stated in other terms, the two CMOS switches of the decoupling structure are turned off, in particular, during a memory/write cycle, this causing no loss in voltage level due to the threshold voltage of the transistors when a high voltage level is intended to be applied to the memory cell so as to write a logic "1". The time required for writing is likewise shortened.

Furthermore, when in the course of a read/rewrite cycle, since the PMOS (for example) transistors of the two CMOS switches are off, and since the two NMOS transistors of these two switches are on, a decoupling is produced between the high part of the bit line connected to all the memory cells and the low part of the bit line, of much smaller length. As a consequence, the line capacitance seen by the amplifier in the read mode is much lower than the total capacitance of the bit line. Hence, when the read signal ("sense") is activated, this results in a much faster divergence between the voltage levels of the bit line and of the reference bit line. Moreover, the reading of the information stored can be performed just after the activation of the read signal ("sense").

Moreover, the presence of two CMOS switches in the decoupling structure allows a particularly advantageous embodiment of the invention, in which the precharge means comprise just a single precharge circuit connected in parallel with the amplification means. This precharge circuit can be on the same side as the memory cell or on the opposite side from the memory cell with respect to the amplification means.

The position of the precharge circuit is of no importance when the gates of two decoupling transistors having the same channel type (for example, the NMOS transistors) are connected to a predetermined bias voltage (in this instance VDD) so as to render these two decoupling transistors permanently on. Of course, the gates of the other two decoupling transistors (in this instance the PMOS transistors) are controlled by the same control signal with two logic states so as to render these other two decoupling transistors on or off.

Thus, according to a mode of implementation of the process according to the invention, the decoupling structure is then placed in its first state in the course of the entirety of the precharge phase. Stated otherwise, in the course of the entire precharge phase, the PMOS decoupling transistors are also on.

This being so, it is particularly advantageous for the precharge circuit to be connected in parallel with the amplification means on the opposite side from the memory cell with respect to the amplification means. In this case, in combination, the decoupling structure is advantageously able to take a third state in which all the decoupling transistors are off.

More precisely, according to a mode of implementation of the process, in the case where the single precharge circuit is connected in parallel with the amplification means on the opposite side from the memory cell with respect to the amplification means, during the precharge phase, the decoupling structure is firstly placed in its first state (all the decoupling transistors on). Then, just before deactivating the precharge means, the decoupling structure is placed in its third state, that is, all the decoupling transistors are turned off. Thus, the disturbance caused by the cutting off of the precharge to the low part of the bit line is limited.

BRIEF DESCRIPTION OF THE DRAWINGS

Other advantages and characteristics of the invention will emerge on examining the detailed description of an embodiment and a mode of implementation, in no way limiting, and of the appended drawings in which.

DETAILED DESCRIPTION OF THE PREFERRED EMBODIMENTS

Figure 1:
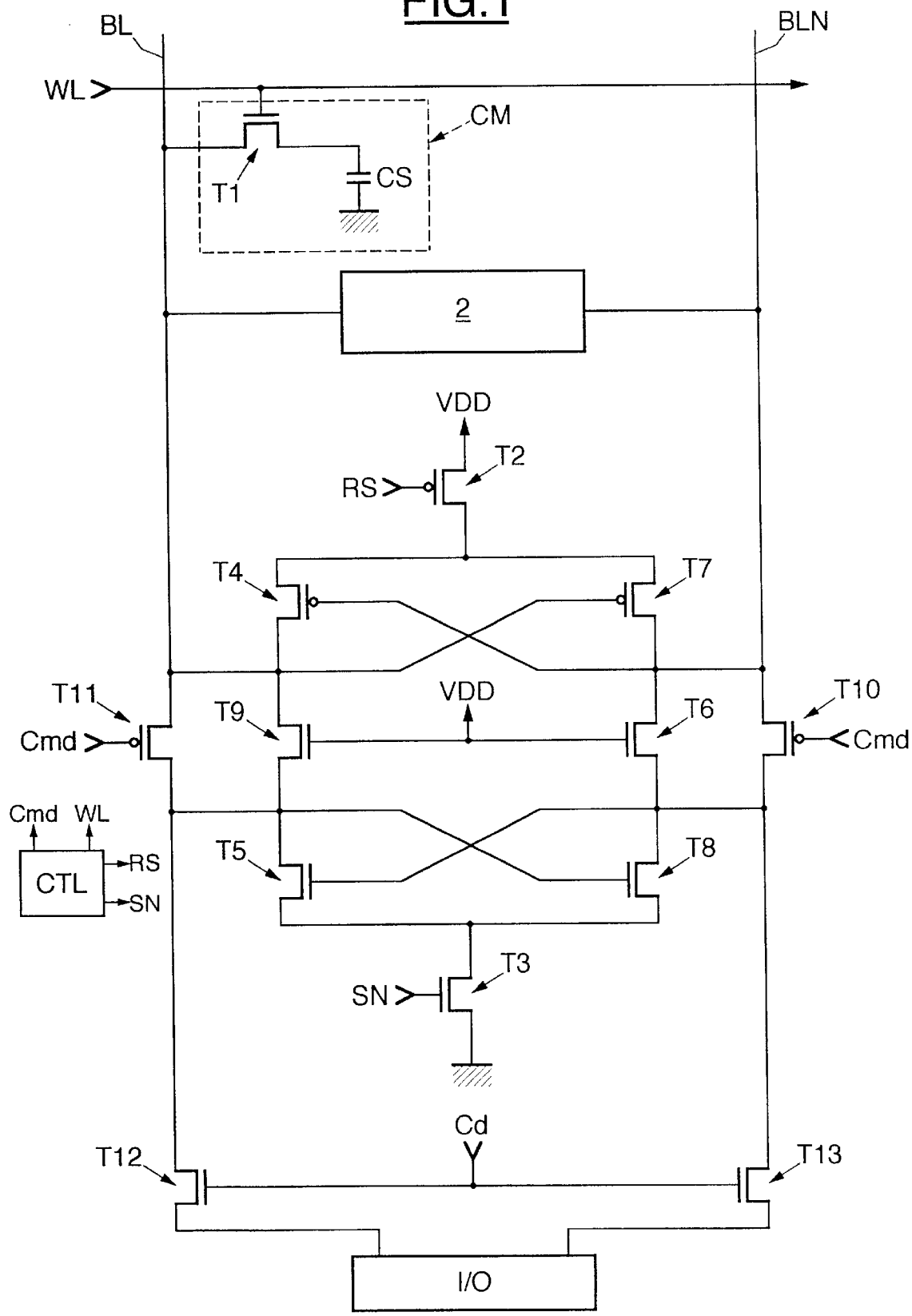
FIG. 1 diagrammatically illustrates the structure of a read/rewrite device according to the invention and, FIG. 2 diagrammatically illustrates a mode of operation of the device according to the invention in the case of a read/rewrite of a logic "1".

For the sake of simplification, FIG. 1 represents only a single memory cell CM comprising a storage capacitance CS and a single transistor T1. Of course, these memory cells CM are laid out in rows and columns. More precisely, in the case illustrated in FIG. 1, all the memory cells CM connected to the same column metallization BL termed "Bit Line" are selected by a word line WL. The metallization of the adjacent column BLN makes it possible to connect in quincunxial fashion other rows of memory cells CM which can be selected respectively by the same word line WL signal. Conventionally, the two columns BL and BLN are connected to input/output means I/O by two NMOS transistors T12 and T13 controlled by a control signal Cd.

In the example described here, the device 1 according to the invention comprises amplification means comprising two inverters each formed by two complementary insulated-gate field-effect transistors, namely two PMOS transistors T4 and T7 and two NMOS transistors T5 and T8. The sources of the two PMOS transistors T4 and T7 are connected to the bias voltage VDD of a high level via a PMOS transistor T2 controlled by a rewrite signal ("restore") RS. Likewise, the sources of the two NMOS transistors T5 and T8 are connected to ground via an NMOS transistor T3 controlled on its gate by a read signal ("sense") SN.

A decoupling structure is connected between the two PMOS transistors T4 and T7 and the two NMOS transistors T5 and T8. This decoupling structure is formed by a first pair of complementary transistors, formed by an NMOS transistor T9 and a PMOS transistor T11, and by a second pair of complementary transistors, formed by an NMOS transistor T6 and a PMOS transistor T10. The gates of the two NMOS decoupling transistors are connected in the example described to the bias voltage VDD, while the gates of the two PMOS decoupling transistors T10 and T11 are controlled by a control signal Cmd. Monitoring means CTL, of conventional construction and comprising in particular logic gates, deliver the signals WL, RS, SN and Cmd.

Moreover, the device comprises precharge means 2, constructed in a manner as would be readily appreciated by those skilled in the art. The precharge means 2 make it possible to precharge the metallizations of columns BL and BLN to a chosen precharge level, for example VDD/2.

A mode of operation of the device according to the invention corresponding to a case where it is desired to read and refresh a logic "1" stored in the memory cell CM will now be described while referring more particularly to FIG. 2. The embodiment illustrated in FIG. 1 will also be drawn upon, in which the NMOS decoupling transistors, whose gates are biased to VDD, are permanently on.

Prior to the reading/rewriting of the data, a precharge phase is performed in which the potentials of the two columns BL and BLN are taken to VDD/2. During this precharge phase, the logic control signal Cmd is at "0" rendering the PMOS decoupling transistors T10 and T11 on. It should be noted here that the on nature of all the decoupling transistors makes it possible to use just a single precharge circuit 2 (which would not have been the case if two NMOS transistors T6 and T9 alone had been used as decoupling structure), and hence this makes it possible to minimize the area of the memory.

At the end of the precharge phase, the precharge means 2 are deactivated and the signal Cmd is set to 1, thus turning off the PMOS decoupling transistors T10 and T11. Those skilled in the art are aware that the deactivating of the precharge means causes a slight voltage disturbance relative to the nominal precharge voltage VDD/2. This disturbance is found on the entirety of the columns BL and BLN, since the NMOS decoupling transistors T6 and T9 were on when deactivating the precharge means. This being so, for the sake of simplification, this voltage disturbance has not been taken into account in the voltage levels indicated in the top part of FIG. 2.

At the start of the read/rewrite cycle, the signal WL is activated thus causing storage capacitance CS of the memory cell to be discharged and the voltage on the column BL to rise, while the reference column BLN retains its precharge voltage value (reference value) VDD/2.

When activating the read control signal SN, a slight decrease occurs in the voltage of column BL and a much faster decrease in the voltage of column BLN since the gate voltage of the transistor T8 is then greater than the gate voltage of the transistor T5. The sign of the voltage $\Delta V$, which can be read almost immediately after activating the signal SN, makes it possible to determine the logic value of the data stored. The discrepancy between the voltages BL and BLN continues to amplify allowing, during activation of the signal RS (that is to say in actual fact when this signal RS goes to zero), correct refreshing of the data stored through amplification of the voltage BL up to the value VDD. Over the same time, the voltage BLN continues to tend to zero.

The read/rewrite cycle is completed by the deactivating of the signal WL followed immediately by the deactivating of the signal SN and of the signal RS (reverting of this signal to "1"). Moreover, during a phase of writing to the memory cell CM, the PMOS decoupling transistors T10 and T11 are turned on (signal Cmd at "0"). This makes it possible, when a high voltage level is applied to the bit line BL to write a logic "1", to avoid passing on from the decoupling structure a drop in the voltage level equal to the threshold voltage of the transistors.

In a preferred embodiment, it is particularly advantageous to arrange the single precharge circuit 2 at the foot of the column, that is to say on the opposite side from the memory cell with respect to the amplification means. It is also preferred to render the NMOS decoupling transistors T6 and T9 controllable on their gates by a second control signal (not represented in FIG. 1 for the sake of simplification) instead of connecting their gate permanently to the bias voltage VDD. This is because, in this case, just before deactivating the precharge means 2, each CMOS decoupling switch is opened. In other words, all of the decoupling transistors are turned off. Thus, when deactivating the precharge circuit, the voltage disturbance created will be limited to the lower part of the columns BL and BLN.

That which is claimed is:

1. A device for reading/rewriting a memory cell of a dynamic random access memory laid out in rows and columns of memory cells, comprising:
    a precharge circuit; and
    an amplifier comprising two inverters, each inverter comprising a P-channel transistor and an N-channel transistor controlled by read and rewrite signals, said amplifier further comprising a decoupling structure connected between the two P-channel transistors and the two N-channel transistors of the two inverters, said decoupling structure comprising two pairs of complementary decoupling transistors connected in parallel and being able on command to take at least a first state and a second state, the decoupling structure in the first state having all the decoupling transistors on, the decoupling structure in the second state having two decoupling transistors having a same conductivity type channel being on while the other two decoupling transistors are off.

2. A device according to claim 1, wherein said precharge circuit is a single precharge circuit connected in parallel with the amplifier on a same side as a memory cell.

3. A device according to claim 1, wherein said precharge circuit is a single precharge circuit connected in parallel with the amplifier on an opposite side from a memory cell with respect to the amplifier.

4. A device according to claim 3, wherein the decoupling structure is able to take a third state in which all the decoupling transistors are off.

5. A device according to claim 4, wherein gates of first and second decoupling transistors having a same conductivity type channel are controlled by a first control signal with two logic states in such a way as to render the first and second decoupling transistors on or off; and wherein gates of third and fourth decoupling transistors are controlled by a common second control signal with two logic states in such a way as to render the third and fourth decoupling transistors on or off.

6. A device according to claim 1, wherein gates of first and second decoupling transistors having a first conductivity type channel are connected to a predetermined bias voltage to render first and second decoupling transistors permanently on; and wherein gates of third and fourth decoupling transistors are controlled by a common control signal with two logic states so as to render the third and fourth decoupling transistors on or off.

7. A device for reading/rewriting a memory cell of a dynamic random access memory, comprising:
    an amplifier comprising two inverters, each inverter comprising a P-channel transistor and an N-channel transistor controlled by read and rewrite signals; and
    a decoupling structure connected between the two P-channel transistors and the two N-channel transistors of the two inverters, said decoupling structure comprising two pairs of complementary decoupling transistors connected in parallel and being able on command to take at least a first state and a second state, the decoupling structure in the first state having all the decoupling transistors on, the decoupling structure in the second state having two decoupling transistors having a same conductivity type channel being on while the other two decoupling transistors are off.

8. A device according to claim 7, further comprising a single precharge circuit connected in parallel with the amplifier on a same side as a memory cell.

9. A device according to claim 7, further comprising a single precharge circuit connected in parallel with the amplifier on an opposite side from a memory cell with respect to the amplifier.

10. A device according to claim 9, wherein the decoupling structure is able to take a third state in which all the decoupling transistors are off.

11. A device according to claim 10, wherein gates of first and second decoupling transistors having a same conductivity type channel are controlled by a first control signal with two logic states in such a way as to render the first and second decoupling transistors on or off; and wherein gates of third and fourth decoupling transistors are controlled by a common second control signal with two logic states in such a way as to render the third and fourth decoupling transistors on or off.

12. A device according to claim 7, wherein gates of first and second decoupling transistors having a first conductivity type channel are connected to a predetermined bias voltage to render first and second decoupling transistors permanently on; and wherein gates of third and fourth decoupling transistors are controlled by a common control signal with two logic states so as to render the third and fourth decoupling transistors on or off.

13. A dynamic random access memory comprising:
    a plurality of memory cells
    a precharge circuit for the memory cells; and
    an amplifier for the memory cells, said amplifier comprising two inverters, each inverter comprising a P-channel transistor and an N-channel transistor controlled by read and rewrite signals, said amplifier further comprising a decoupling structure connected between the two P-channel transistors and the two N-channel transistors of the two inverters, said decoupling structure comprising two pairs of complementary decoupling transistors connected in parallel and being able on command to take at least a first state and a second state, the decoupling structure in the first state having all the decoupling transistors on, the decoupling structure in the second state having two decoupling transistors having a same channel conductivity type being on while the other two decoupling transistors are off.

14. A dynamic random access memory according to claim 13, wherein said precharge circuit is a single precharge circuit connected in parallel with the amplifier on a same side as a memory cell.

15. A dynamic random access memory according to claim 13, wherein said precharge circuit is a single precharge circuit connected in parallel with the amplifier on an opposite side from a memory cell with respect to the amplifier.

16. A dynamic random access memory according to claim 15, wherein the decoupling structure is able to take a third state in which all the decoupling transistors are off.

17. A dynamic random access memory according to claim 16, wherein gates of first and second decoupling transistors having a same conductivity type channel are controlled by a first control signal with two logic states in such a way as to render the first and second decoupling transistors on or off;

and wherein gates of third and fourth decoupling transistors are controlled by a common second control signal with two logic states in such a way as to render the third and fourth decoupling transistors on or off.

18. A dynamic random access memory according to claim 13, wherein gates of first and second decoupling transistors having a first conductivity type channel are connected to a predetermined bias voltage to render first and second decoupling transistors permanently on; and wherein gates of third and fourth decoupling transistors are controlled by a common control signal with two logic states so as to render the third and fourth decoupling transistors on or off.

19. A process for controlling a device for reading/rewriting a memory cell of a dynamic random access memory arranged in rows and columns, the device of a type comprising for each column a precharge circuit and an amplifier, the amplifier comprising two inverters each formed by a P-channel and an N-channel transistor and controlled by read and rewrite signals, and a decoupling structure connected between the two P-channel transistors and the two N-channel transistors of the two inverters, the decoupling structure comprising two pairs of complementary decoupling transistors connected in parallel and being able on command to take at least a first state and a second state, the decoupling structure in the first state having all of the decoupling transistors on, and the decoupling structure in the second state having two decoupling transistors with a same conductivity type channel being on while the other two decoupling transistors are off, the process comprising the steps of:

placing the decoupling structure to the first state in a course of a cycle of writing to the memory cell; and placing the decoupling structure to the second state in a course of a read/rewrite cycle following a precharge phase.

20. A process according to claim 19, wherein the precharge circuit is a single precharge circuit connected in parallel with the amplifier on a same side as the memory cell or on the opposite side from the memory cell with respect to the amplifier; and further comprising the step of placing the decoupling structure to the first state in a course of at least a part of the precharge phase.

21. A process according to claim 19, wherein the precharge circuit is a single precharge circuit connected in parallel with the amplifier on a same side as the memory cell or on an opposite side from the memory cell with respect to the amplifier; and further comprising the step of placing the decoupling structure to the first state in a course of the entire precharge phase.

22. A process according to claim 19, wherein the precharge circuit is a single precharge circuit connected in parallel with the amplifier on an opposite side from the memory cell with respect to the amplifier; wherein the decoupling structure is also able to take a third state in which all of the decoupling transistors are off; and further comprising the steps of:

during the precharge phase, placing the decoupling structure in the first state; and just before deactivating the precharge circuit, placing the decoupling structure in the third state.

* * * * *